US010506216B2

(12) United States Patent
Watanabe

(10) Patent No.: US 10,506,216 B2
(45) Date of Patent: Dec. 10, 2019

(54) IMAGING SYSTEM INCLUDING LIGHT SOURCE, IMAGE SENSOR, AND DOUBLE-BAND PASS FILTER

(71) Applicant: Panasonic Intellectual Property Management Co., Ltd., Osaka (JP)

(72) Inventor: Hisashi Watanabe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 197 days.

(21) Appl. No.: 15/595,975

(22) Filed: May 16, 2017

(65) Prior Publication Data

US 2017/0347086 A1 Nov. 30, 2017

(30) Foreign Application Priority Data

May 27, 2016 (JP) ................. 2016-105851

(51) Int. Cl.
*G01J 3/50* (2006.01)
*G02B 1/00* (2006.01)
(Continued)

(52) U.S. Cl.
CPC ............ *H04N 13/25* (2018.05); *G02B 5/201* (2013.01); *G02B 5/208* (2013.01); *G06T 7/521* (2017.01); *H01L 27/307* (2013.01); *H04N 5/332* (2013.01); *H04N 9/045* (2013.01); *H04N 13/156* (2018.05); *H04N 13/254* (2018.05); *H04N 13/257* (2018.05); *H04N 13/268* (2018.05); *H04N 13/271* (2018.05); *H01L 51/0046* (2013.01);
(Continued)

(58) Field of Classification Search
CPC ......... H01L 27/14621; H01L 27/14625; H01L 25/0657; H01L 27/14649
See application file for complete search history.

(56) References Cited

U.S. PATENT DOCUMENTS

| | | | |
|---|---|---|---|
| 5,929,432 A | 7/1999 | Yamakawa | |
| 2005/0242385 A1* | 11/2005 | Yamaguchi | ....... H01L 27/14601 257/304 |

(Continued)

FOREIGN PATENT DOCUMENTS

| | | |
|---|---|---|
| JP | 8-143853 | 6/1996 |
| JP | 10-065135 | 3/1998 |

(Continued)

*Primary Examiner* — Alison Slater
(74) *Attorney, Agent, or Firm* — McDermott Will & Emery LLP

(57) ABSTRACT

An imaging system includes a light source that, in operation, emits an emitted light containing a near-infrared light in a first wavelength region, an image sensor, and a double-band pass filter that transmits a visible light in at least a part of a wavelength region out of a visible region and the near-infrared light in the first wavelength region. The image sensor includes light detection cells, a first filter that selectively transmits the near-infrared light in the first wavelength region, second to fourth filters that selectively transmit lights in second to fourth wavelength regions, respectively, which are contained in the visible light, and an infrared absorption filter. The infrared absorption filter faces the second to fourth filters and absorbs the near-infrared light in the first wavelength region.

14 Claims, 10 Drawing Sheets

(51) Int. Cl.

| | | |
|---|---|---|
| *G02B 5/22* | (2006.01) | |
| *H01L 27/146* | (2006.01) | |
| *H04N 5/33* | (2006.01) | |
| *H04N 13/25* | (2018.01) | |
| *H04N 13/156* | (2018.01) | |
| *H04N 13/254* | (2018.01) | |
| *H04N 13/257* | (2018.01) | |
| *G06T 7/521* | (2017.01) | |
| *G02B 5/20* | (2006.01) | |
| *H01L 27/30* | (2006.01) | |
| *H04N 9/04* | (2006.01) | |
| *H04N 13/271* | (2018.01) | |
| *H04N 13/268* | (2018.01) | |
| *H01L 51/00* | (2006.01) | |
| *H04N 13/00* | (2018.01) | |

(52) U.S. Cl.
 CPC .. *H01L 51/0054* (2013.01); *H04N 2013/0077* (2013.01)

(56) References Cited

U.S. PATENT DOCUMENTS

| | | | |
|---|---|---|---|
| 2007/0201738 A1 | 8/2007 | Toda et al. | |
| 2008/0079806 A1 | 4/2008 | Inuiya et al. | |
| 2010/0123070 A1* | 5/2010 | Natori | H01L 27/14647 250/226 |
| 2011/0195235 A1 | 8/2011 | Kato et al. | |
| 2011/0245538 A1 | 10/2011 | Kato et al. | |
| 2014/0091418 A1* | 4/2014 | Taguchi | C09B 23/04 257/432 |
| 2014/0120473 A1* | 5/2014 | Aoyagi | G02B 5/20 430/285.1 |
| 2014/0240492 A1* | 8/2014 | Lee | H04N 5/2256 348/136 |
| 2015/0171146 A1* | 6/2015 | Ooki | H01L 27/14621 250/208.1 |
| 2015/0196199 A1 | 7/2015 | Toda | |
| 2015/0221691 A1 | 8/2015 | Watanabe | |
| 2016/0128627 A1* | 5/2016 | Demos | A61B 5/0075 600/473 |
| 2017/0020627 A1* | 1/2017 | Tesar | A61B 90/20 |
| 2017/0345860 A1* | 11/2017 | Nagaya | G02B 5/22 |

FOREIGN PATENT DOCUMENTS

| | | |
|---|---|---|
| JP | 2002-146254 | 5/2002 |
| JP | 2002-182270 | 6/2002 |
| JP | 2007-053731 | 3/2007 |
| JP | 2007-189376 | 7/2007 |
| JP | 2008-085159 | 4/2008 |
| JP | 2008-091535 | 4/2008 |
| JP | 2010-222557 | 10/2010 |
| JP | 2011-208101 | 10/2011 |
| JP | 2012-029130 | 2/2012 |
| JP | 2015-132546 | 7/2015 |
| JP | 2016-096423 | 5/2016 |
| WO | 2014/041742 | 3/2014 |

* cited by examiner

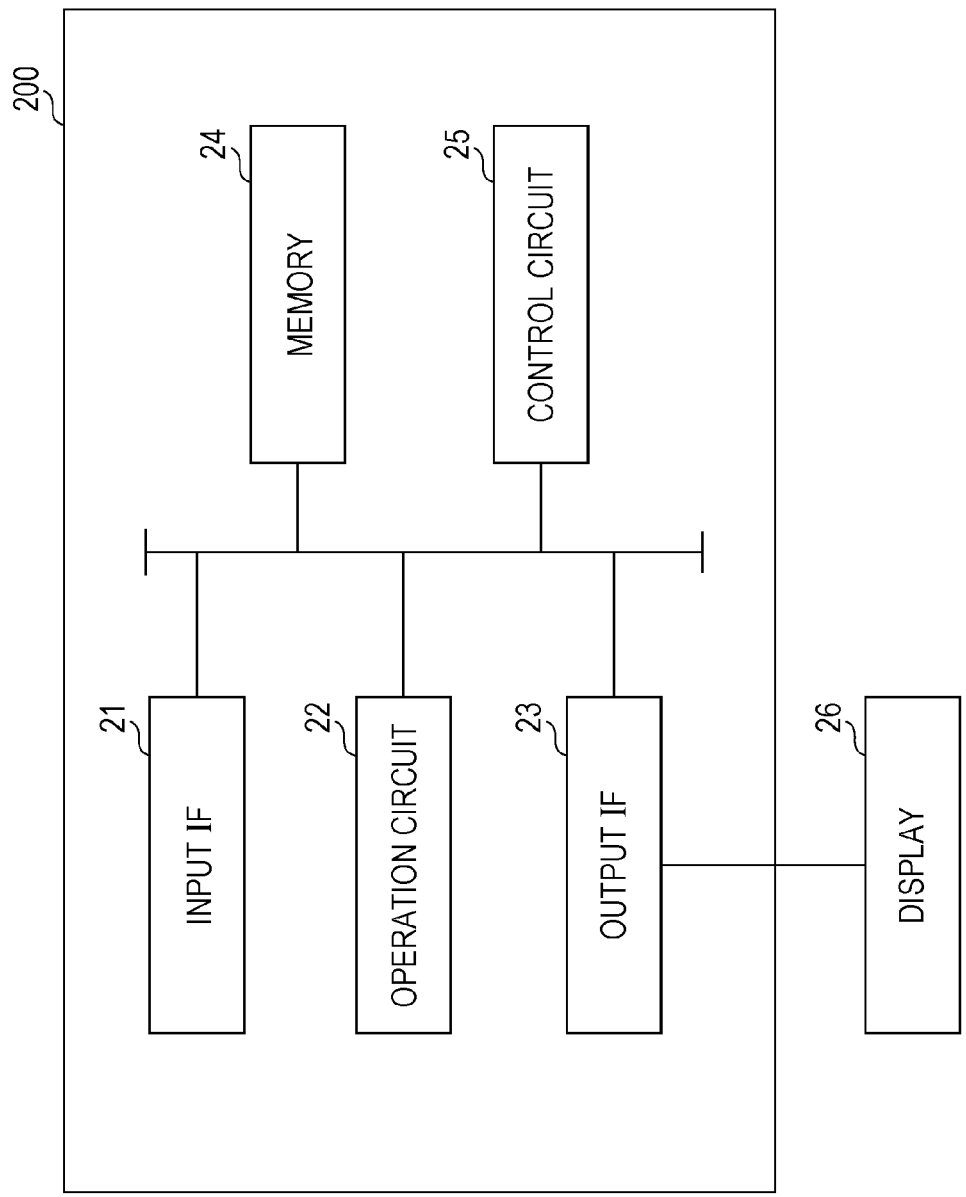

IMAGING SYSTEM INCLUDING LIGHT SOURCE, IMAGE SENSOR, AND DOUBLE-BAND PASS FILTER

BACKGROUND

1. Technical Field

The present disclosure relates to an imaging system.

2. Description of the Related Art

When a color image is generated using a camera including an image sensor (for example, a solid-state imaging device), generally, an infrared absorption filter is arranged in the middle of an optical path. This is because when an infrared absorption filter is not used, due to an influence of a near-infrared light, near-infrared signals are mixed into red, green, and blue signals, whereby an image with unnatural colors are generated. A camera in which an infrared absorption filter is used is disclosed in Japanese Unexamined Patent Application Publication No. 2002-182270, for example.

Meanwhile, a camera capable of acquiring a visible image and a near-infrared image using a common optical system has also been proposed. This kind of camera is disclosed in Japanese Unexamined Patent Application Publication No. 10-65135, Japanese Unexamined Patent Application Publication No. 2007-189376, and Japanese Unexamined Patent Application Publication No. 2007-53731, for example.

SUMMARY

In one general aspect, the techniques disclosed here feature an imaging system including a light source that, in operation, emits an emitted light containing a near-infrared light in a first wavelength region, an image sensor, and a double-band pass filter that is arranged on a path of an incident light entering the image sensor and transmits a visible light in at least a part of a wavelength region out of a visible region and the near-infrared light in the first wavelength region. The image sensor includes light detection cells, a first filter, a second filter, a third filter, a fourth filter, and an infrared absorption filter. Each of the light detection cells, in operation, receives a part of the incident light and outputs an electrical signal in accordance with a light receiving amount. The first filter faces a first light detection cell included in the light detection cells and selectively transmits the near-infrared light in the first wavelength region. The second filter faces a second light detection cell included in the plurality of light detection cells and selectively transmits a light in a second wavelength region contained in the visible light. The third filter faces a third light detection cell included in the light detection cells and selectively transmits a light in a third wavelength region contained in the visible light. The fourth filter faces a fourth light detection cell included in the light detection cells and selectively transmits a light in a fourth wavelength region contained in the visible light. The infrared absorption filter faces the second filter, the third filter, and the fourth filter, absorbs the near-infrared light in the first wavelength region, and transmits the visible light.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1F is a block diagram illustrating an example of a schematic configuration of a signal processing device;

DETAILED DESCRIPTION

Figure 1A:
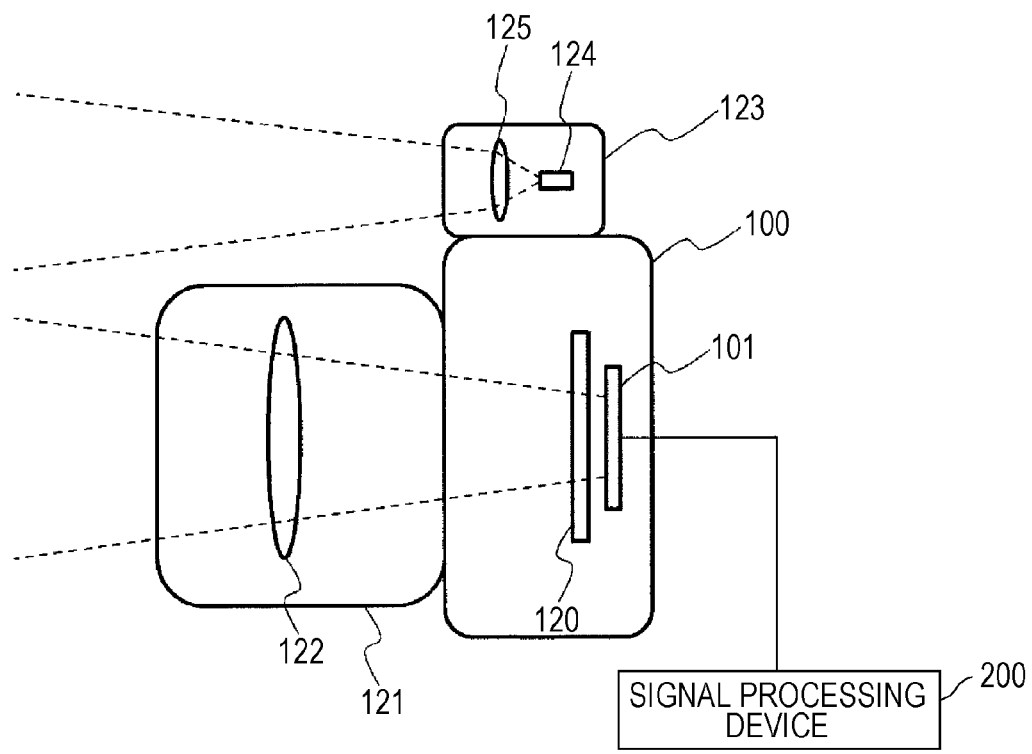
FIG. 1A is a diagram illustrating a schematic configuration of an imaging system according to a first embodiment.

Before an embodiment according to the present disclosure is described, the underlying knowledge forming the basis of the present disclosure will be described. Herein, infrared radiation as well as a visible light is expressed as a "light", and infrared radiation may be referred to as an "infrared light".

Generally, when a color image is generated with a camera or a camera module using an image sensor, an infrared cut filter has to be inserted in the middle of an optical path. A color filter that has conventionally been used functions as a color filter that transmits only one of three primary colors of blue, green, and red, for example, in a visible light region, but the shading performance thereof in a near-infrared region is low. With this, the color filter transmits not only a light in a desired color but a near-infrared light. Human eyes do not have sensitivity to a near-infrared light, but a silicon substrate generally used in an image sensor has sensitivity to a near-infrared light in a wavelength region up to approximately 1,100 nm. When an infrared cut filter is not used, due to an influence of a near-infrared light, near-infrared signals are mixed into red, green, and blue signals, whereby an image with unnatural colors are generated.

Meanwhile, a near-infrared light contains an abundant amount of information, and there thus is a use for acquiring a near-infrared image. This includes a use in testing, monitoring, and the like of items, for example, foods, agricultural products, chemicals, and paper money. Furthermore, application of near-infrared light imaging seems to be expanded. For example, a monitoring camera, distance measurement, and machine vision using a near-infrared light can be cited.

For the above-described uses, an imaging system dedicated for an infrared light is used in many cases. Meanwhile, there is a demand for acquiring a near-infrared image at the same time acquiring a visible light image. This is for the purpose of achieving downsizing, cost reduction, and convenience of a device. If a visible image and a near-infrared image can be acquired with the same imaging optical system, deviation between the two types of images can be made smaller. For this reason, when using a method with which new information is acquired by an operation using the two types of images, which is referred to as computational photography, an advantage of enabling use of a plurality of images with the same field of view without deviation can be obtained. Conventionally, in a system as described above, a near-infrared image and a visible image have generally been acquired using separate optical systems. However, with this kind of method, a parallax is generated between the two types of images. In order to correct the parallax, complicated image processing is required, and high-speed processing is disabled. If a visible image and a near-infrared image can be acquired at the same time using a common optical system, complicated image processing can be omitted and information can be acquired from the images with high precision and high speed.

The imaging systems with which a near-infrared image is used include a passive lighting system and an active lighting system. The passive lighting system is a system with which imaging is performed by using a normal illumination light or a natural light and no near-infrared illumination light for imaging. The active lighting system is a system with which imaging is performed by using a near-infrared illumination light for imaging. In recent years, there has been an attempt of measuring a structure or a characteristic of an object from a near-infrared image. In the above-described computational photography and machine vision, various near-infrared lighting systems are used. For example, pulse illumination used in a time-of-flight (TOF) method and pattern illumination used in a structured illumination microscopy can be cited. For a near-infrared light source for acquiring a near-infrared image as described above, a light source such as a light emitting diode (LED) or a laser whose wavelength band is small is used in many cases.

In order to respond to a requirement that a visible image and a near-infrared image are acquired using the same optical system, an imaging system having a pixel that detects a near-infrared light in addition to conventional red, green, and blue pixels has been produced. In a pixel that detects a near-infrared light, a near-infrared filter that transmits only a near-infrared light is arranged on a light receiver. A near-infrared filter is also referred to as a black filter because the near-infrared filter does not transmit a visible light. However, in this kind of imaging system, as described above, infrared lights enter red, green, and blue pixels, disabling acquisition of a normal color image.

In order to solve this problem, a configuration has been proposed in which an infrared cut filter is formed on only red, green, and blue pixels. For example, Japanese Unexamined Patent Application Publication No. 10-65135 discloses using a color filter formed of an organic material equivalent to a normal color filter as an infrared cut filter although the details are not clearly described. Meanwhile, Japanese Unexamined Patent Application Publication No. 2007-189376 and Japanese Unexamined Patent Application Publication No. 2007-53731 disclose using an interference filter formed of an inorganic multilayer film as an infrared cut filter. Neither Japanese Unexamined Patent Application Publication No. 10-65135 nor Japanese Unexamined Patent Application Publication No. 2007-189376 describes the details of the optical characteristics of an infrared filter or an infrared cut filter. Japanese Unexamined Patent Application Publication No. 2007-53731 states that no strict restriction is needed for the optical characteristics of the filter. Japanese Unexamined Patent Application Publication No. 2007-53731 discloses an example in which an infrared cut filter having a characteristic of shielding a near-infrared light whose wavelength is on the order of 600 to 800 nm and a near-infrared filter having a characteristic of transmitting a near-infrared light whose wavelength is equal to or longer than 750 nm are used.

The present inventor has found that when an interference filter formed of an inorganic multilayer film as disclosed in Japanese Unexamined Patent Application Publication No. 2007-189376 and Japanese Unexamined Patent Application Publication No. 2007-53731 is used as an infrared cut filter, there is a problem described below.

(1) When an inorganic multilayer film is stacked on a substrate of an image sensor, the number of stackable layers has a limitation. With this, it is difficult to obtain sufficient infrared cut characteristics.

(2) Because an interference filter does not absorb but reflects a near-infrared light, a reflection is generated on a surface of a component such as a lens or a sealing glass inside an imaging system. The reflected light causes a flare and lowers the quality of an image.

With regard to (1) above, the limitation of the number of stackable layers depends on the production process and pixel size of an image sensor, but generally is on the order of 10 layers. The number of layers exceeding this causes the layers to be too thick and deteriorates the optical characteristics of the image sensor. Furthermore, as the number of layers increases, the production cost of a chip is increased. An interference filter whose number of layers is on the order of 10 transmits several to 10% of near-infrared lights. Furthermore, when an interference filter is formed with a semiconductor process, the film thickness of the multilayer film can be varied. Consequently, the characteristics of the interference filter can be varied, lowering a yield rate.

As higher performance is promoted for devices such as a digital camera or a mobile phone, a function that has not conventionally been included in such devices has come to be demanded. For example, enabling acquisition of not only an image with a beautiful visible light but also a near-infrared image by using a single imaging system is demanded. Furthermore, a system that can display a visible image and a near-infrared image at the same time is demanded. However, with a conventional imaging system enabling acquisition of a visible image and a near-infrared image at the same time, it has been difficult to acquire a beautiful and natural visible light image due to an influence of a near-infrared light. In particular, in an imaging system with which a near-infrared lighting is turned on for imaging, the intensity of a near-infrared light emitted from the lighting is high. Consequently, although it is possible to acquire a near-infrared image with high luminance, a near-infrared light is mixed into a visible pixel, deteriorating color reproductivity in a color image.

In view of this, the present inventor has arrived at a configuration of an imaging system described in items below.

[Item 1]

An imaging system according to item 1 of the present disclosure includes a light source that, in operation, emits an emitted light containing a near-infrared light in a first wavelength region, an image sensor, and a double-band pass filter that is arranged on a path of an incident light entering the image sensor and transmits a visible light in at least a part of a wavelength region out of a visible region and the near-infrared light in the first wavelength region. The image sensor includes light detection cells, a first filter, a second filter, a third filter, a fourth filter, and an infrared absorption filter. Each of the light detection cells, in operation, receives a part of the incident light and outputs an electrical signal in accordance with a light receiving amount. The first filter faces a first light detection cell included in the light detection cells and selectively transmits the near-infrared light in the first wavelength region. The second filter faces a second light detection cell included in the light detection cells and selectively transmits a light in a second wavelength region contained in the visible light. The third filter faces a third light detection cell included in the light detection cells and selectively transmits a light in a third wavelength region contained in the visible light. The fourth filter faces a fourth light detection cell included in the light detection cells and selectively transmits a light in a fourth wavelength region contained in the visible light. The infrared absorption filter faces the second filter, the third filter, and the fourth filter, absorbs the near-infrared light in the first wavelength region, and transmits the visible light.

[Item 2]

The imaging system according to item 1 may further include a signal processing device that is connected to the image sensor and, in operation, generates a signal indicating an image by using a first electrical signal output from the first light detection cell, a second electrical signal output from the second light detection cell, a third electrical signal output from the third light detection cell, and a fourth electrical signal output from the fourth light detection cell.

[Item 3]

In the imaging system according to item 2, the image may include a visible image and a near-infrared image, and
the signal processing device may, in operation,
generate a signal indicating the visible image by using the second electrical signal, the third electrical signal, and the fourth electrical signal, and
generate a signal indicating the near-infrared image by using the first electrical signal.

[Item 4]

In the imaging system according to item 2, the signal processing device may, in operation,
generate information on a visible image by using the second electrical signal, the third electrical signal, and the fourth electrical signal, and
superimpose the information on the visible image with information obtained by an operation using the first electrical signal to generate the signal indicating the image.

[Item 5]

In the imaging system according to item 4, the light source may, in operation, emit the emitted light on a living body, and
the information obtained by the operation using the first electrical signal may be information on the living body.

[Item 6]

In the imaging system according to any one of items 2 to 5, the signal processing device may, in operation, further generate information on a distance to an object by using the first electrical signal.

[Item 7]

In the imaging system according to item 6, the emitted light may be a pulse light, and
the signal processing device may, in operation, generate the information on the distance by using a time taken by the pulse light to be detected by the light detection cells after emitted from the light source.

[Item 8]

In the imaging system according to item 6, the light source may, in operation, project a pattern of lights on the object, and
the signal processing device may, in operation, generate information on a near-infrared image by using the first electrical signal, and generate the information on the distance based on a position of the pattern of lights in the near-infrared image.

[Item 9]

In the imaging system according to item 6, the signal processing device may, in operation,
generate information on a visible image by using the second electrical signal, the third electrical signal, and the fourth electrical signal, and
superimpose the information on the visible image with the information on the distance to generate the signal indicating the image.

[Item 10]

In the imaging system according to item 6, the image may be a stereo image, and
the signal processing device may, in operation,
generate information on a visible image by using the second electrical signal, the third electrical signal, and the fourth electrical signal, and
use the information on the distance to convert the visible image into the stereo image.

[Item 11]

In the imaging system according to any one of items 1 to 10, each of the light detection cells may include two electrodes, an organic photoelectric conversion film between the two electrodes, and a signal accumulator electrically connected to one of the two electrodes.

[Item 12]

In the imaging system according to any one of items 1 to 11, the infrared absorption filter may be an organic membrane filter.

In the present disclosure, all or a part of any of circuit, unit, device, part, or portion, or all or a part of any of functional blocks in the block diagrams may be implemented as one or more of electronic circuits including, but not limited to, a semiconductor device, a semiconductor integrated circuit (IC), or a large scale integration (LSI). The LSI or IC can be integrated into one chip, or also can be a combination of plural chips. For example, functional blocks other than a memory may be integrated into one chip. The name used here is LSI or IC, but it may also be called system LSI, very large scale integration (VLSI), or ultra large scale integration (ULSI) depending on the degree of integration.

A field programmable gate array (FPGA) that can be programmed after manufacturing an LSI or a reconfigurable logic device that allows reconfiguration of the connection or setup of circuit cells inside the LSI can be used for the same purpose.

Further, it is also possible that all or a part of the functions or operations of the circuit, unit, device, part, or portion are implemented by executing software. In such a case, the software is recorded on one or more non-transitory recording media such as a ROM, an optical disk, or a hard disk drive, and when the software is executed by a processor, the software causes the processor together with peripheral devices to execute the functions specified in the software. A system or device may include such one or more non-transitory recording media on which the software is recorded and a processor together with necessary hardware devices such as an interface.

The image sensor used in embodiments of the present disclosure may be a silicon image sensor (for example, a CMOS sensor or a CCD sensor) that is widely used in general, and may be an organic-laminate-based image sensor or a compound semiconductor image sensor. A photoelectric conversion layer formed of a single crystal silicon has a low sensitivity to a near-infrared light whose wavelength is equal to or longer than 1,000 nm and has no sensitivity to a near-infrared light exceeding 1,200 nm. For this reason, when an infrared lighting whose wavelength is longer than 1,000 nm is used, it is effective to use an image sensor having a photoelectric conversion layer formed of a material other than silicon.

According to the embodiments of the present disclosure, for example, a visible image substantially corresponding to the human visual sensitivity and a near-infrared image which cannot be seen by human eyes can be acquired at the same time. Because a visible image and a near-infrared image can be acquired with the same imaging optical system, it is possible to enhance downsizing and reduction of the cost of a device. Furthermore, performing signal processing of the two types of images enables implementation of an imaging system that can be utilized for not only photographing but various applications.

The embodiments of the present disclosure will be described below with reference to the drawings. It should be noted that each of the embodiments described below indicates a comprehensive or a specific example. A numerical value, a shape, a material, a component, an arrangement and connection form of components, a step, an order of steps, and the like which are described in the following embodiments are merely an example and not intended to limit the present disclosure. Various aspects described herein can be combined with one another unless a contradiction occurs. Furthermore, out of the components described in the embodiments below, any component that is not described in the independent claim indicating the uppermost concept will be described as an optional component. In the description below, components having a function substantially the same or similar will be denoted with a common reference numerals, and overlapped descriptions may be omitted.

(First Embodiment)

Figure 1B:
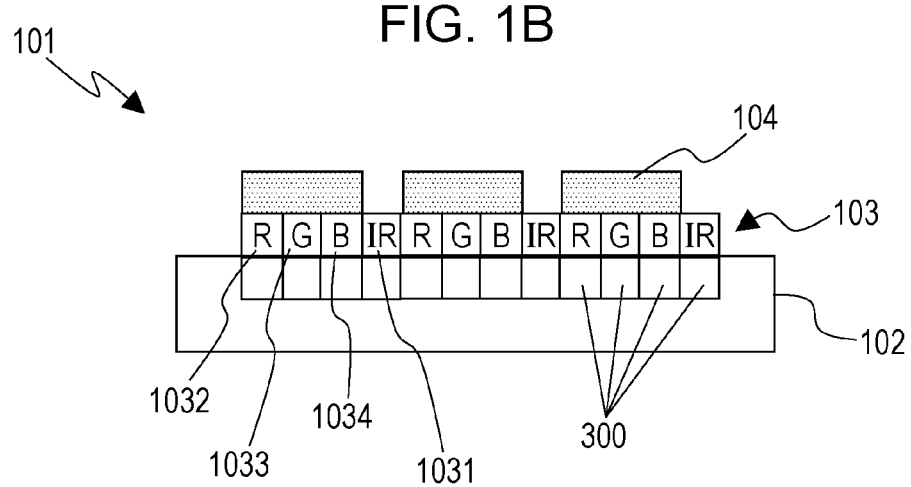
FIG. 1B is a cross-sectional view schematically illustrating a configuration of an image sensor used in the imaging system according to the first embodiment.
Figure 1C:
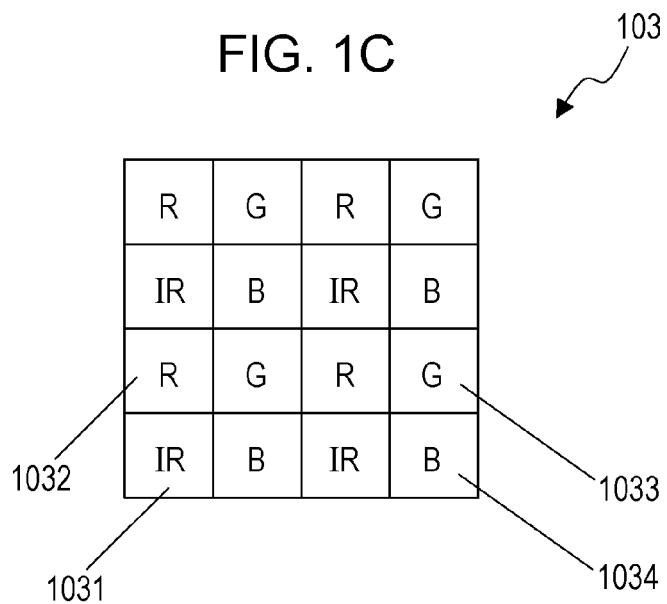
FIG. 1C is a plan view illustrating a layout of a plurality of light detection cells of the image sensor used in the imaging system according to the first embodiment.
Figure 1D:
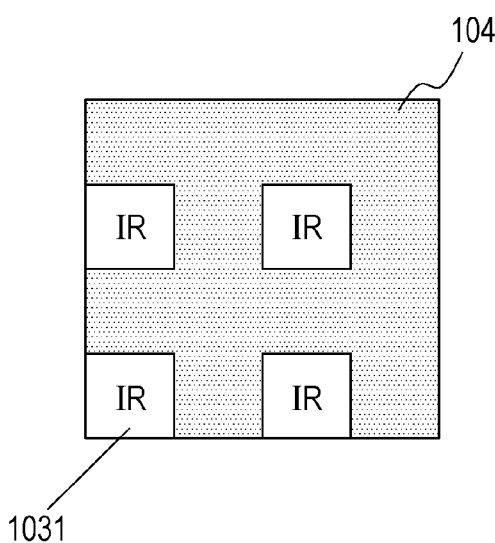
FIG. 1D is a plan view illustrating an example of an arrangement of an infrared absorption filter of the image sensor used in the imaging system according to the first embodiment.
Figure 1E:
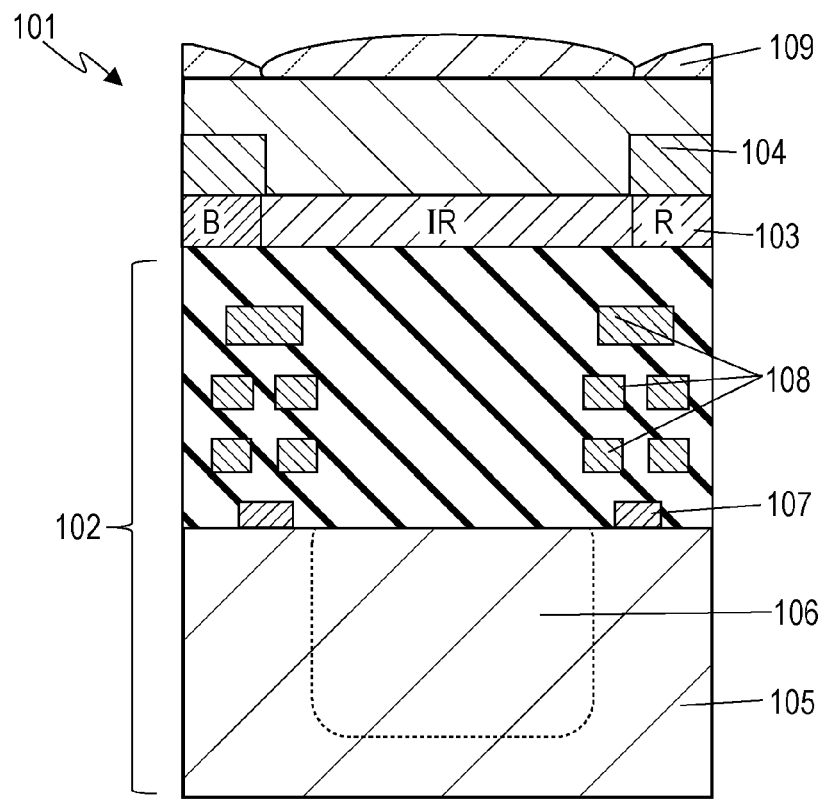
FIG. 1E is a cross-sectional view illustrating a more detailed configuration of the image sensor.

FIG. 1A is a diagram illustrating a schematic configuration of an imaging system according to a first embodiment. FIG. 1B is a cross-sectional view schematically illustrating a configuration of an image sensor 101 used in the imaging system according to the first embodiment. FIG. 1C is a plan view illustrating a layout of a plurality of light detection cells of the image sensor 101 used in the imaging system according to the first embodiment. FIG. 1D is a plan view illustrating an example of an arrangement of an infrared absorption filter 104 of the image sensor 101 used in the imaging system according to the first embodiment. FIG. 1E is a cross-sectional view illustrating a more detailed configuration of the image sensor 101.

As illustrated in FIG. 1A, the imaging system according to the present embodiment includes a light source unit 123, a camera 100, a camera lens 121, and a signal processing device 200. The light source unit 123 includes a light source 124 that emits a light containing a near-infrared light in a first wavelength region and an optical system 125 limiting a lighted region. The optical system 125 includes at least one lens. The camera 100 includes the image sensor 101 and a double-band pass filter 120. The double-band pass filter 120 is arranged on an optical path of a light entering the image sensor 101 and transmits a visible light in at least a part of a wavelength region out of a visible region and the near-infrared light in the first wavelength region. The double-band pass filter 120 also can be referred to as a "2-wavelength transmitting filter", a "dual-band-pass filter", or a "multi-band-pass filter". The image sensor 101 includes three types of visible light pixels that respectively detect lights in three wavelength regions contained in a visible light (for example, wavelength regions of red, green, and blue) and a near-infrared pixel that detects a near-infrared light in the first wavelength region. The image sensor 101 includes an infrared absorption filter that absorbs the near-infrared light in the first wavelength region on the visible light pixel. The camera lens 121 includes at least one lens 122. The signal processing device 200 is connected to the image sensor 101. The signal processing device 200 processes a signal output from the image sensor 101 to generate various types of image information.

The components will be described below in more details.

The light source 124 can be a light-emitting element, for example, an LED light source or a laser light source that emits a near-infrared light of a narrow band. The first wavelength region being a wavelength region of the near-infrared light emitted by the light source 124 can be a wavelength region of a narrow band centered on 870 nm, for example. The type of and the wavelength region used by the light source 124 can be selected as appropriate in accordance with the purpose or the use. The light source 124 may emit not only a near-infrared light but also a visible light depending on the use.

The double-band pass filter 120 has a characteristic of transmitting a visible light (for example, a light in a wavelength region of 400 to 650 nm) in at least a part of a wavelength region out of a visible region and a near-infrared light in a wavelength region (for example, 820 to 920 nm) centered on a wavelength (for example, 870 nm) of the near-infrared light emitted from the light source 124 and cutting lights in other wavelength regions. It should be noted that the wavelength region of a light transmitted by the double-band pass filter 120 is not limited to the above-described wavelength regions, and can be selected as appropriate in accordance with the use. For example, the wavelength region of the visible light to be transmitted may be set to 400 to 700 nm. Furthermore, the wavelength region of the near-infrared light to be transmitted may be set to 870±20 nm or 870±25 nm, for example. At this point, "transmit" or "cut" does not mean transmitting or cutting by 100%. For example, when the double-band pass filter 120 is an interference filter, a transmittance in a transmittance wavelength region can be 90% or higher, and a transmittance in a cut wavelength region can be suppressed to 2% to 5% or lower. When the double-band pass filter 120 is an absorption filter, a transmittance in a transmittance wavelength region can be 80% or higher, and a transmittance in a cut wavelength region can be suppressed to 10% or lower.

In the present embodiment, a wavelength region of a near-infrared light emitted from the light source 124 for lighting, a wavelength region of a near-infrared light transmitted by the double-band pass filter 120, and a wavelength region of a near-infrared light transmitted by a near-infrared filter in the image sensor 101 are overlapped with one another at least in a part thereof. These wavelength regions do not have to completely match with one another. It is sufficient if the overlapped wavelength region corresponds to a wavelength region to be detected. For example, the light source 124 may emit a near-infrared light in a wavelength region that is broad to some extent as well as a near-infrared light of a narrow band. An optical characteristic of each of the optical elements will be described later.

FIG. 1B illustrates a schematic configuration of the image sensor 101. The image sensor 101 in the present embodiment has the same configuration as that of a standard image sensor such as a CMOS except for a difference that the image sensor 101 includes the infrared absorption filter 104 and a near-infrared filter 1031. A part having the same configuration as that of a standard image sensor is simplified in FIG. 1B and illustrated as a substrate 102.

The image sensor 101 includes the substrate 102 that has a plurality of light detection cells 300 being a light receiver, a color filter 103 arranged so as to face the plurality of light detection cells 300, and the infrared absorption filter 104 formed so as to cover a part of the color filter 103. Each of the plurality of light detection cells 300 can include a photodiode that outputs an electrical signal in accordance with a light receiving amount by photoelectric conversion. The color filter 103 includes a red filter 1032, a green filter 1033, a blue filter 1034, and a near-infrared filter 1031. The red filter 1032, the green filter 1033, the blue filter 1034, and the near-infrared filter 1031 are formed so as to cover respective ones of the plurality of light detection cells 300 in accordance with a regular plane pattern. The near-infrared filter 1031, the red filter 1032, the green filter 1033, and the blue filter 1034 correspond to the first filter, the second filter, the third filter, and the fourth filter respectively in the present disclosure.

FIG. 1C illustrates an example of an array of the color filter 103. A plurality of light detection cells as well as the red filter 1032, the green filter 1033, the blue filter 1034, and the near-infrared filter 1031 disposed thereon are arrayed in a matrix shape, as illustrated in FIG. 10. The light detection cells positioned under the red filter 1032, the green filter 1033, the blue filter 1034, and the near-infrared filter 1031 function as light detection cells that detect a red light, a green light, a blue light, and a near-infrared light, respectively. In the description below, for simplification, the light detection cells that detect a red light, a green light, and a blue light are referred to as a red pixel, a green pixel, and a blue pixel, respectively. The light detection cell that detects a near-infrared light is referred to as a near-infrared pixel. In the present embodiment, the near-infrared pixel, the red pixel, the green pixel, and the blue pixel correspond to the first light detection cell, the second light detection cell, the third light detection cell, and the fourth light detection cell, respectively.

The plurality of pixels arranged in a matrix shape are divided into a plurality of unit blocks in units of 2×2, and these unit blocks are two-dimensionally arrayed. In a manner facing the four light detection cells in each unit block, the red filter 1032, the green filter 1033, the blue filter 1034, and the near-infrared filter 1031 are arranged. The near-infrared filter 1031 has a characteristic of selectively transmitting the near-infrared light in the first wavelength region emitted from the light source 124. The red filter 1032 has a characteristic of selectively transmitting a light in a red wavelength region that is contained in a visible light. The green filter 1033 has a characteristic of selectively transmitting a light in a green wavelength region that is contained in a visible light. The blue filter 1034 has a characteristic of selectively transmitting a light in a blue wavelength region that is contained in a visible light. With this, in each unit block, the red pixel, the green pixel, the blue pixel, and the near-infrared pixel are contained. In the example illustrated in FIG. 10, an arrangement is employed in which one of green pixels in a Bayer array used in a general image sensor is replaced with a near-infrared pixel. The Bayer array is a standard arrangement of color pixels in which two green pixels are arranged on diagonal positions of a 2×2 matrix and a red pixel and a blue pixel are arranged on the remaining diagonal positions. In the present embodiment, the red wavelength region, the green wavelength region, and the blue wavelength region correspond to the second wavelength region, the third wavelength region, and the fourth wavelength region, respectively.

In the present embodiment, the red filter 1032, the green filter 1033, and the blue filter 1034 are arranged. However, instead of these, filters of other colors may be arranged. For example, a cyan filter that selectively transmits a light in a cyan wavelength region which corresponds to a combination of blue and green, a yellow filter that selectively transmits a light in a yellow wavelength region which corresponds to a combination of green and red, and a magenta filter that selectively transmits a light in a magenta wavelength region which corresponds to a combination of red and blue may be used instead. Even in that case, the signal processing device 200 can perform an operation using a signal from each visible light pixel to calculate signal components of red, green, and blue, thereby generating information on a visible light image.

As illustrated in FIG. 1D, the infrared absorption filter 104 is formed on three pixels of a red pixel, a green pixel, and a blue pixel out of the four pixels included in a unit block of 2×2, and not formed on a near-infrared pixel. That is to say, the infrared absorption filter 104 has an opening on a near-infrared pixel and the near-infrared filter 1031. The embodiment is not limited to the example illustrated in FIG. 1D, and the infrared absorption filter 104 may be separated into a plurality of regions. With this configuration, the near-infrared light is absorbed by the infrared absorption filter 104, and thus does not enter a red pixel, a green pixel, or a blue pixel which are visible pixels and enters only a near-infrared pixel. The infrared absorption filter 104 can be formed of an organic material, for example, as described later. For this reason, the infrared absorption filter 104 may be referred to as an "organic film filter".

As the image sensor 101 in the present embodiment, for example, a CMOS type silicon image sensor which is widely used in general can be used. The CMOS image sensor used for trial production by the present inventor is a CMOS image sensor of 2,100,000 pixels with a pixel size of 2.75 µm×2.75 µm.

FIG. 1E illustrates, in more detail, a cross-sectional structure of the image sensor 101 illustrated in a simplified manner in FIG. 1B. FIG. 1E illustrates a structure of the substrate 102 which is omitted in FIG. 1B. A production method of the substrate 102 is common to a production method of a standard CMOS image sensor except for forming processes of the infrared absorption filter 104 and the near-infrared filter 1031. For this reason, herein, detailed descriptions of the production method of the substrate 102 are omitted and only the outline thereof is described, and the forming processes of the infrared absorption filter 104 and the near-infrared filter 1031 will be described in detail.

The image sensor 101 can be produced in the following manner. A photodiode 106 corresponding to each of the light detection cells is formed by injecting ion into a silicon substrate 105, and then a transistor 107, a metal wire 108, the color filter 103, the infrared absorption filter 104, and a plurality of micro lenses 109 are formed on the silicon substrate 105. Each of the light detection cells formed on the silicon substrate 105 includes a reading circuit for reading an electrical signal output from the photodiode 106 electrically converting an incident light. The silicon substrate 105 has a plurality of photodiodes 106 on a surface thereof. The light detection cells can be formed so as to be arranged in a matrix form as illustrated in FIG. 1C in plan view of the surface of the silicon substrate 105.

The image sensor 101 can be produced with a process described below, for example. Firstly, the substrate 102 is formed with a production process of a general CMOS image sensor. Thereafter, a photolithography process is used to sequentially form the green filter 1033, the blue filter 1034, the red filter 1032, and the near-infrared filter 1031 on a pixel region. The process up to this is the same as a production process of a general color image sensor. In the present embodiment, in addition to this, the near-infrared filter 1031 that cuts a visible light and transmits only a near-infrared light is formed on the pixel region.

FIG. 1F is a block diagram illustrating an example of a schematic configuration of the signal processing device 200. In FIG. 1F, a display 26 connected to the signal processing device 200 is also illustrated. The display 26 may be embedded in the signal processing device 200. The signal processing device 200 includes an input interface (IF) 21 electrically connected to the image sensor 101, an operation circuit 22 that performs various types of signal processing, a memory 24 that records therein various types of data, a control circuit 25 that controls operations of the entire device, and an output interface (IF) 23 that outputs the data. The display 26 is connected to the output IF 23 and displays a processing result. The operation circuit 22 can be an image processing circuit, for example, a digital signal processor (DSP). The control circuit 25 can be an integrated circuit, for example, a central processing unit (CPU) or a microcomputer. The control circuit 25 executes a control program stored in the memory 24, for example, to perform control such as an operation instruction to the operation circuit 22. The control circuit 25 and the operation circuit 22 may be implemented by one integrated circuit. The signal processing device 200 may be provided inside the camera 100. Meanwhile, the signal processing device 200 may be an element outside the imaging system. The signal processing device 200 may be a computer (for example, a server computer) provided in a place remote from the imaging system.

The signal processing device 200 generates a signal indicating an image from a plurality of electrical signals output from the plurality of light detection cells in the image sensor 101 and outputs the generated signals. More specifically, the signal processing device 200 can generate a signal indicating a visible image from the second electrical signal output from the light detection cell facing the red filter 1032, the third electrical signal output from the light detection cell facing the green filter 1033, and the fourth electrical signal output from the light detection cell facing the blue filter 1034, and output the generated signal. Furthermore, the signal processing device 200 can generate a signal indicating a near-infrared signal from the first electrical signal output from the light detection cell facing the near-infrared filter 1031 and output the generated signal.

Figure 2:
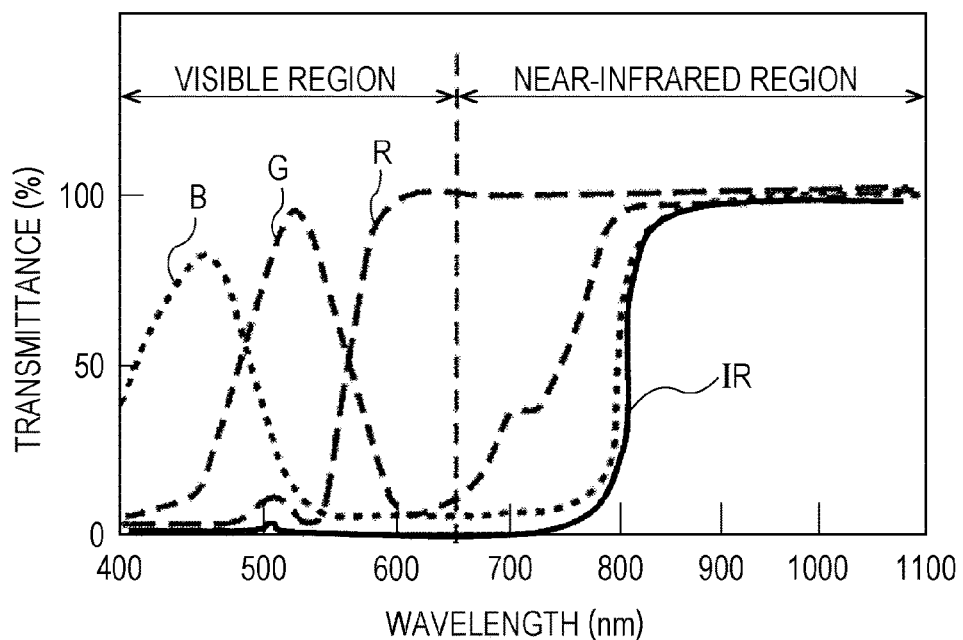
FIG. 2 is an example of a characteristic of color filters formed on the light detection cells of the image sensor.

FIG. 2 illustrates an example of a characteristic of the color filter 103 formed on the light detection cells of the image sensor 101. In FIG. 2, IR represents a characteristic of the near-infrared filter 1031, R represents a characteristic of the red filter 1032, G represents a characteristic of the green filter 1033, and B represents a characteristic of the blue filter 1034. The red filter 1032, the green filter 1033, and the blue filter 1034 have the same characteristics as a color filter used in a general color image sensor in general. The near-infrared filter 1031 has a characteristic of transmitting a near-infrared light of 800 nm or longer in this example. The near-infrared filter 1031 has a characteristic of transmitting the near-infrared light in the first wavelength region emitted from the light source 124. Although a filter that transmits a near-infrared light whose wavelength is 800 nm or longer is selected as the near-infrared filter 1031 in this example, other filters may be selected. For example, the near-infrared filter 1031 may be formed of a material that transmits a light whose wavelength is 650 nm or longer (for example, disclosed in International Publication No. 2014/041742). In the near-infrared filter 1031, a material can be used that transmits the near-infrared light in the first wavelength region emitted from the light source 124 and prevents transmittance of lights whose wavelengths are shorter than that as much as possible. With this, incidence of a visible light on a near-infrared pixel can be suppressed.

Figure 3:
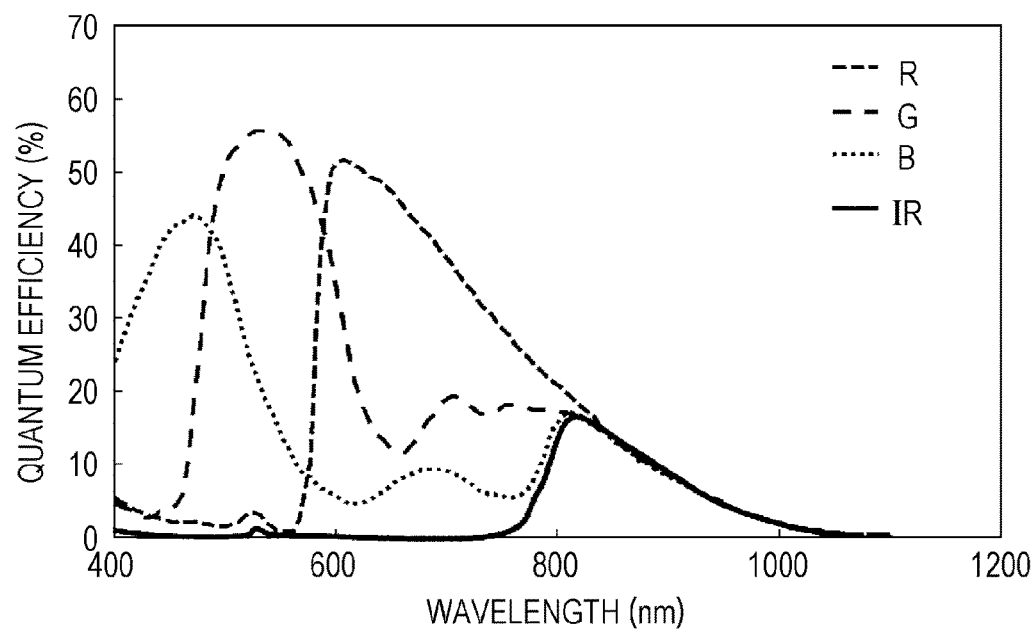
FIG. 3 illustrates a spectral sensitivity characteristic of each of a red pixel, a green pixel, a blue pixel, and a near-infrared pixel in an image sensor in a comparative example.

An optical characteristic required for each component in the imaging system according to the present embodiment will be described below. One of purposes of the imaging system according to the present embodiment is to acquire a color image and a near-infrared image at the same time. At the time of imaging, it is desired that no visible light is mixed into a near-infrared pixel and no near-infrared light is mixed into a visible pixel. The present inventor has designed the imaging system according to the present embodiment for the purpose of enabling imaging as desired. When the red filter 1032, the green filter 1033, the blue filter 1034, and the near-infrared filter 1031 as illustrated in FIG. 2 are employed, normally, the red filter 1032, the green filter 1033, and the blue filter 1034 transmit a near-infrared light. For the purpose of comparison, the present inventor has produced for trial an image sensor for a comparative example by using the red filter 1032, the green filter 1033, the blue filter 1034, and the near-infrared filter 1031, and not using the infrared absorption filter 104. FIG. 3 illustrates a spectral sensitivity characteristic of each of a red pixel, a green pixel, a blue pixel, and a near-infrared pixel in an image sensor in a comparative example. The spectral sensitivity characteristic corresponds to wavelength dependence of sensitivity. The silicon substrate has a characteristic with which the sensitivity peak is near 550 nm and the sensitivity is lowered towards the short wavelength side and the long wavelength side. With this, quantum efficiency, which is the sensitivity of the image sensor, is the highest with green and is lowered in a range of blue at the short wavelength side and red at the long wavelength side to infrared. As can be seen from FIG. 3, the sensitivity is low especially with 1,000 nm or longer. With a wavelength of 1,200 nm or longer, the bandgap of the silicon becomes larger, and the image sensor thus does not have sensitivity. As illustrated in FIG. 3, with a wavelength of 800 nm or longer, not only a near-infrared pixel but all visible pixels have sensitivity. This is because, as illustrated in FIG. 2, the red filter 1032, the green filter 1033, and the blue filter 1034 transmit a wavelength of 800 nm or longer. With this, when imaging is performed with a near-infrared light irradiated, a near-infrared component is superimposed on a signal of a visible pixel, disabling acquisition of a normal color image. For this reason, in the present embodiment, on a part other than a near-infrared pixel on the image sensor, the infrared absorption filter 104 is formed.

Figure 4:
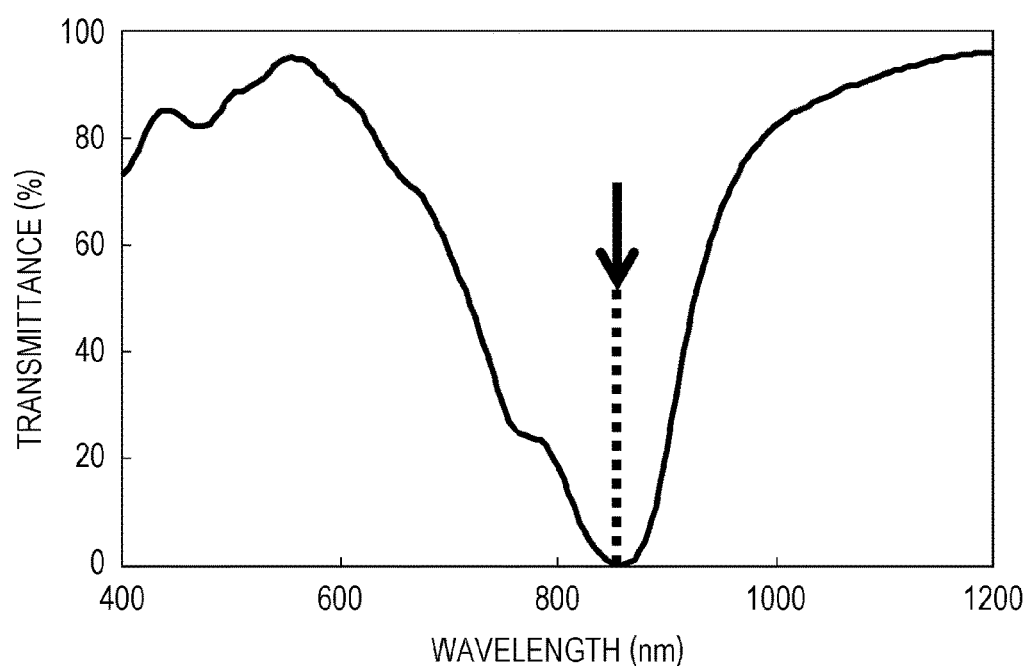
FIG. 4 illustrates an example of a characteristic of the infrared absorption filter.

FIG. 4 illustrates an example of a characteristic of the infrared absorption filter 104 that can be used in the present embodiment. In this example, a filter material is used that has high absorbability at 870 nm being a center wavelength of a light from the light source 124, which is marked with an arrow in FIG. 4. The infrared absorption filter 104 is formed only on a visible pixel, thereby preventing the visible pixel from receiving an influence of a near-infrared light and enabling the near-infrared pixel to retain necessary near-infrared sensitivity.

Figure 5A:
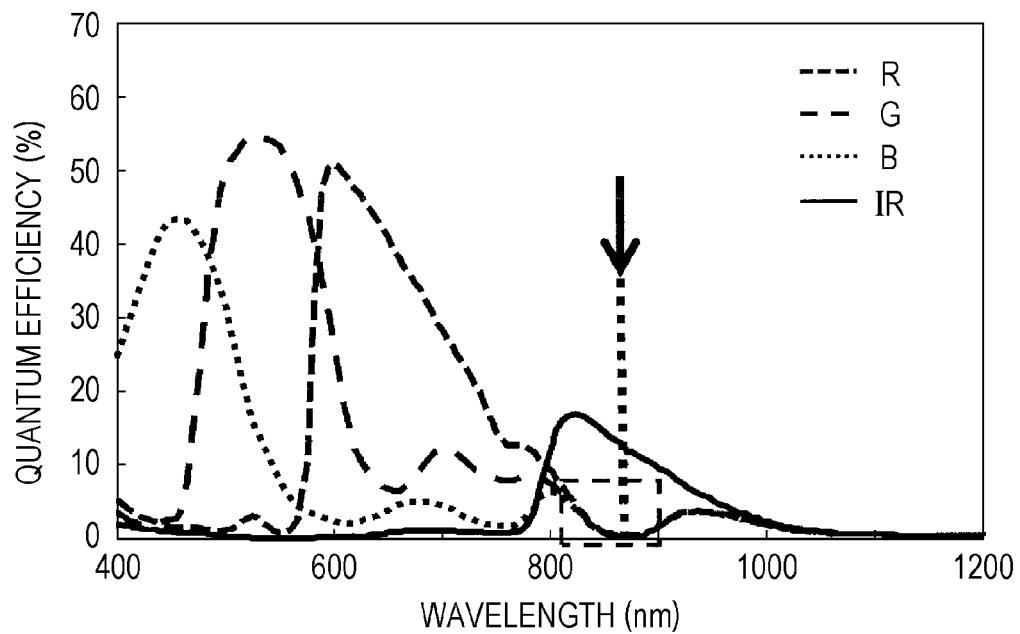
FIG. 5A illustrates a spectral sensitivity characteristic of each pixel of a produced image sensor.
Figure 5B:
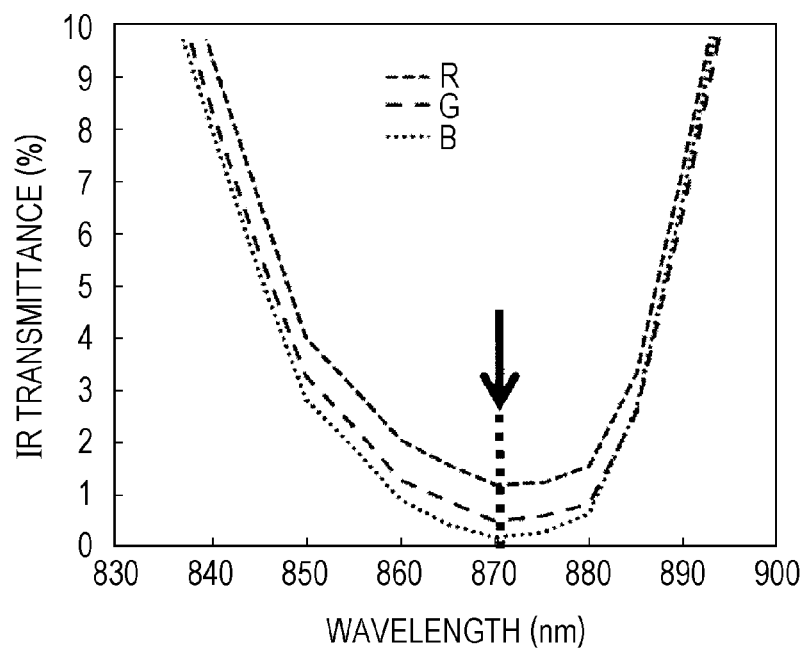
FIG. 5B illustrates a light transmittance in the vicinity of a center wavelength of a light from a light source in each of the red pixel, the green pixel, and the blue pixel.

The present inventor has produced an image sensor by using the red filter 1032, the green filter 1033, the blue filter 1034, and the near-infrared filter 1031 whose characteristics are illustrated in FIG. 2, and the infrared absorption filter 104 whose characteristic is illustrated in FIG. 4. FIG. 5A illustrates a spectral sensitivity characteristic of each pixel of the produced image sensor. FIG. 5B illustrates a light transmittance in the vicinity of 870 nm being a center wavelength of a light from the light source 124 in each of the red pixel, the green pixel, and the blue pixel. FIG. 5B illustrates a characteristic surrounded by a broken line frame in FIG. 5A in an enlarged manner. As can be seen from FIG. 5B, light transmittance of each pixel is suppressed to be low. With the green pixel and the blue pixel, in particular, light transmittance of 1% or lower can be obtained. This is enabled by the high absorbability of an organic pigment which is a material of the infrared absorption filter 104.

Using the image sensor having the characteristics illustrated in FIG. 5A has enabled removal of an influence of a near-infrared illumination light entering a visible pixel. However, in order to provide a color image having good color reproductivity, a further problem still remains. When a near-infrared light whose wavelength is other than the wavelength of the light source (in the present embodiment, a narrow band centered on 870 nm) is present in an imaging scene, the near-infrared light can enter a visible pixel. In that case, normal color reproduction is disabled. When visible lighting that is present besides the light source 124 is LED lighting or fluorescent lighting, a light from that lighting scarcely includes infrared component and thus causes no problem. However, when an object is irradiated with an outdoor sunlight or a light from an incandescent lamp, there is an influence of a near-infrared light contained in that light.

Figure 6:
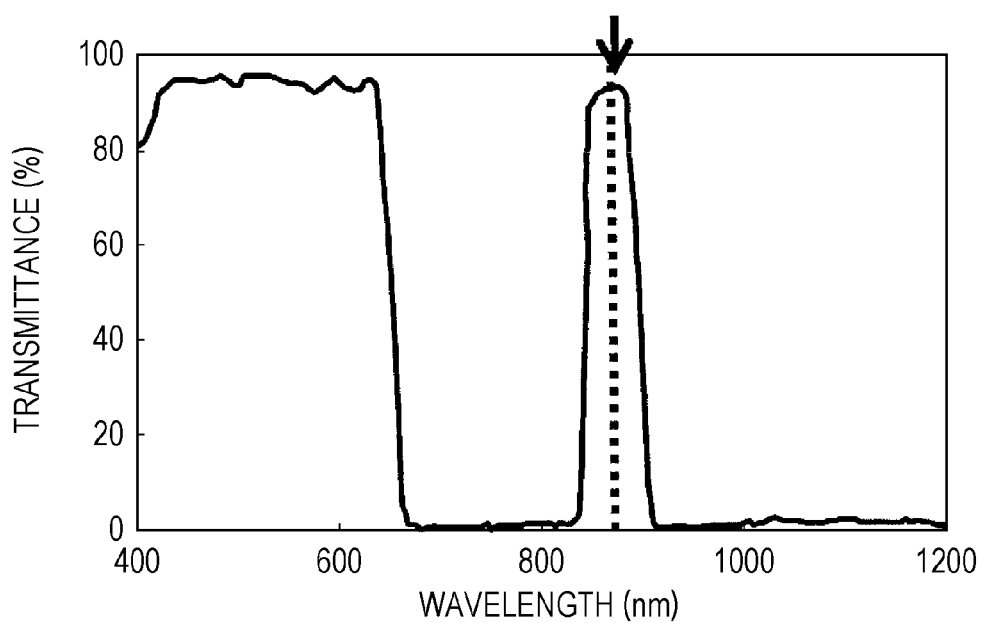
FIG. 6 illustrates an example of a transmittance characteristic of a double-band pass filter.

In the present embodiment, the double-band pass filter 120 is installed in the camera 100, whereby the above-described problem can be solved. The double-band pass filter 120 in the present embodiment is arranged in a position right in front of the image sensor 101, which is the position where an infrared cut filter is arranged in a general camera. FIG. 6 illustrates an example of a transmittance characteristic of the double-band pass filter 120 that can be used in the present embodiment. In this example, a filter is employed that has light transmission property in a wavelength region of a visible light (400 to 650 nm) and in a wavelength region of a near-infrared illumination light (820 to 920 nm) and cuts lights in other wavelength regions.

Figure 7:
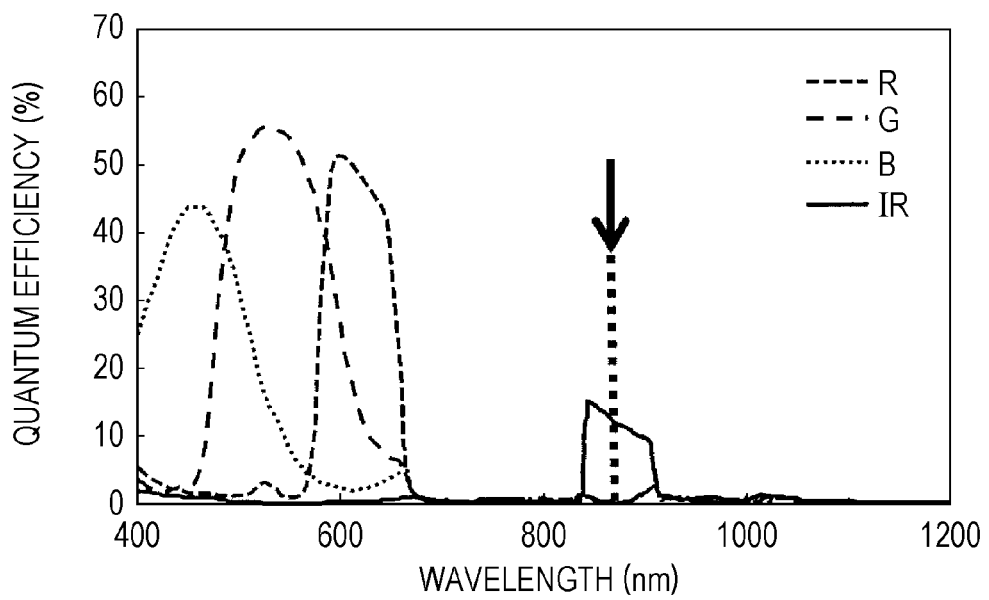
FIG. 7 illustrates a spectral sensitivity characteristic of each pixel of the imaging system according to the first embodiment that includes a double-band pass filter.

FIG. 7 illustrates a spectral sensitivity characteristic of each pixel of the imaging system according to the present embodiment that includes the double-band pass filter 120 as described above. The red pixel, the green pixel, and the blue pixel have sensitivity only to a light in a wavelength region of red, green, and blue, respectively. The near-infrared pixel does not have sensitivity to a visible light and has sensitivity only to a narrow wavelength range centered on a wavelength of a near-infrared illumination light. The characteristics illustrated in FIG. 7 are the spectral sensitivity characteristics of the imaging system in the present embodiment.

Figure 8:
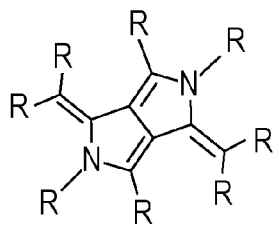
FIG. 8 illustrates an example of an organic material that can be used in the infrared absorption filter.

The infrared absorption filter 104 that can be used in the present embodiment will now be described in more details. FIG. 8 illustrates an example of an organic material that can be used in the infrared absorption filter 104. This absorption material is a near-infrared absorption compound whose center absorption wavelength is 870 nm. This compound is disclosed in Japanese Unexamined Patent Application Publication No. 2010-222557, for example. In FIG. 8, R represents a substituent, and an absorption wavelength can be changed by changing an R. With this, a material having a near-infrared absorption characteristic corresponding to the wavelength of the illumination light can be obtained. The near-infrared absorption compound illustrated in FIG. 8 can be mixed with an acrylic resin (base polymer), a photosensitizer, and a cyclohexanone solvent to produce an infrared absorption filter having a photosensitivity. This material has a photosensitivity and thus can be formed by pattern formation with a lithography process, similarly to a general color filter. As a near-infrared absorption material, the material is not limited to the compound illustrated in FIG. 8, and a squarylium compound disclosed in Japanese Unexamined Patent Application Publication No. 2011-208101, ytterbium chloride disclosed in Japanese Unexamined Patent Application Publication No. 8-143853, and a croconium dye disclosed in Japanese Unexamined Patent Application Publication No. 2002-146254 can be used, for example. These materials have different absorption wavelengths from one another, and by changing a terminal substituent of each compound, the absorption wavelength thereof can be finely adjusted. This enables selection of a wavelength in accordance with the use and the characteristics of the imaging system.

Next, an advantage of the infrared absorption filter 104 according to the present embodiment will be described. Each of Japanese Unexamined Patent Application Publication No. 2007-189376 and Japanese Unexamined Patent Application Publication No. 2007-53731 discloses using an interference filter formed of an inorganic multilayer film as an infrared cut filter stackable on an image sensor. When this kind of conventional interference filter is stacked on an image sensor, cutting an intense near-infrared light has been difficult, which can be achieved in the present embodiment. This is because the total number of films having different refractive indexes that can be stacked is limited to on the order of 10 layers at the maximum due to a limitation with a semiconductor process. An examination by the present inventor has found that an interference type of infrared cut filter stacked on an image sensor can suppress transmittance of a near-infrared light only down to on the order of several % at the minimum. Furthermore, because an interference type of infrared cut filter does not absorb but reflects an infrared light, a near-infrared light reflected on the image sensor is reflected on a surface of a component such as a camera lens or a sealing glass to reenter the image sensor, causing a problem with image quality such as a flare, in some cases. The infrared absorption filter 104 according to the present embodiment absorbs a near-infrared light and thus does not generate reflection and thus does not cause a problem with image quality such as a flare. This is also an advantage of using the infrared absorption filter 104 according to the present embodiment which is an absorption type.

If a near-infrared light of a wide band, for example 650 to 1,200 nm, can be cut using an absorption type of infrared cut filter, it is thought that there is no need to use a double-band pass filter at the camera side, leading to cost reduction. However, in order to arrange this kind of filter on an image sensor, it is necessary to realize intense near-infrared absorption achieving transmittance of 1% or lower with a film thickness of approximately 2 µm or smaller. It is difficult to realize such a filter. This is because high absorption property is a characteristic stemming from chemical bond of an absorbent and thus intense absorption cannot be obtained in a wide wavelength band. For this reason, in the present embodiment, the wavelength region of the near-infrared light emitted from the light source 124, the wavelength region of the near-infrared light transmitted by the double-band pass filter 120, and the wavelength region of the near-infrared light absorbed by the infrared absorption filter 104 are matched. This has relatively easily implemented an imaging system that has a desired performance.

Subsequently, an application example of the above-described imaging system will be described. Currently, the use of distance measurement using a near-infrared light has been expanded. The use includes a game, a gesture control, and a three-dimensional spatial perception, for example. With respect to distance measurement using a near-infrared light, for example, a time-of-flight (TOF) method has come to be widely used with which a uniform pulse light is irradiated on an object and a time taken by the light to return from the object is measured, whereby the distance is calculated. Furthermore, a structured illumination microscopy has come to be widely used with which a pattern of a near-infrared light (for example, a pattern of a plurality of light spots or dots) is projected on an object, and based on a position of the projected light in a near-infrared image acquired, the distance to the object is measured. With these techniques, it is general to use a method with which information on a distance to an object which has been measured using a near-infrared light and information on an image acquired from a general color camera are combined by signal processing to synthesize motions of the object or three-dimensional spaces. For this purpose, a near-infrared light source and two cameras (a near-infrared camera and a visible camera) are combined to be used, in general. If a near-infrared image for distance measurement and a color image of an object can be imaged at the same time with one camera, not only downsizing and cost reduction of a device are realized, but also a need of a correction operation for synthesizing images from two cameras is eliminated. As a result, there is an advantage that an operation load becomes light, enabling image processing with high precision and high speed. However, as has been described above, with a conventional imaging system, the amount of near-infrared lights entering a visible pixel is large, and it is thus difficult to acquire a near-infrared image and a color image at the same time with one image sensor. For this reason, with a conventional system (for example, Kinect of Microsoft Corporation and RealSense of Intel Corporation), a method has been employed with which two cameras acquire a near-infrared image and a color image, and the acquired images are synthesized for spatial perception. By contrast, using the imaging system according to the present embodiment has enabled acquisition of a beautiful color image and a near-infrared image having a high contrast at the same time with one camera.

An example of generating distance information or three-dimensional information using the imaging system according to the present embodiment will be described below. The light source 124 can be a laser light source whose wavelength is 870 nm, for example. At an outlet part of the laser light source, a diffractive optical element (DOE) dedicatedly designed can be arranged. This optical element is designed to irradiate an object with an incident laser light separated into a plurality of dots. The plurality of dots can be pseudo-random dots of 155×155 points at emitting angles of 45 degrees×45 degrees, for example. A pattern of lights in a dot image that have been irradiated on the object with such a laser light source is imaged by the image sensor 101.

The signal processing device 200 can generate information on the distance to the object from an electrical signal output from a near-infrared pixel being the light detection cell facing the near-infrared filter 1031. The signal processing device 200 identifies a position of a pattern of lights from a near-infrared image generated from the electrical signal output from the near-infrared pixel. From a correlation between the position of the pattern in the image and a known dot pattern, a distance between the object and the imaging system can be calculated. Because the projected pattern is a pseudo-random pattern programmed in advance by a DOE, a position of the projected dot pattern can be identified by calculating a correlation between the imaged pattern and the designed pattern. From that positional relationship, the distance between the object and the imaging system can be calculated.

When the imaging system according to the present embodiment is used for distance measurement by a TOF method, the light source 124 can be configured to irradiate a pulse light on an object. The signal processing device 200 can generate the information on the distance to the object from a time taken by the pulse light to be detected by the plurality of light detection cells after emitted from the light source 124. The signal processing device 200 also can generate a signal indicating an image in which information on a visible image is superimposed with the information on the distance and output the generated signal. This image can be displayed on the display 26 illustrated in FIG. 1F, for example. The signal processing device 200 may use the information on the distance generated as described above to convert a visible image into a stereo image, and output a signal indicating the stereo image.

In the present embodiment, a near-infrared image and a color image are imaged on the same imaging surface of the image sensor. For this reason, superimposition of these two images does not require complicated correction in a conventional method that uses two cameras. In other words, with the configuration according to the present embodiment, the distance of the object imaged in the color image can be acquired immediately. Using the imaging system according to the present embodiment has enabled three-dimensional measurement with high precision and high speed using a light-weight, compact-sized, and a low-cost device. These techniques can be effective not only in the use of a gesture control, a game, or the like but also in an industrial field such as image recognition for machine vision, vehicle use, or the like.

(Second Embodiment)

Next, as a second embodiment, an imaging system using an organic-laminate-based image sensor will be described. As a photoelectric conversion film, an appropriate organic material is used, whereby sensitivity to a near-infrared light can be increased as compared with a case where a silicon photodiode is used as a photoelectric conversion film.

Figure 9:
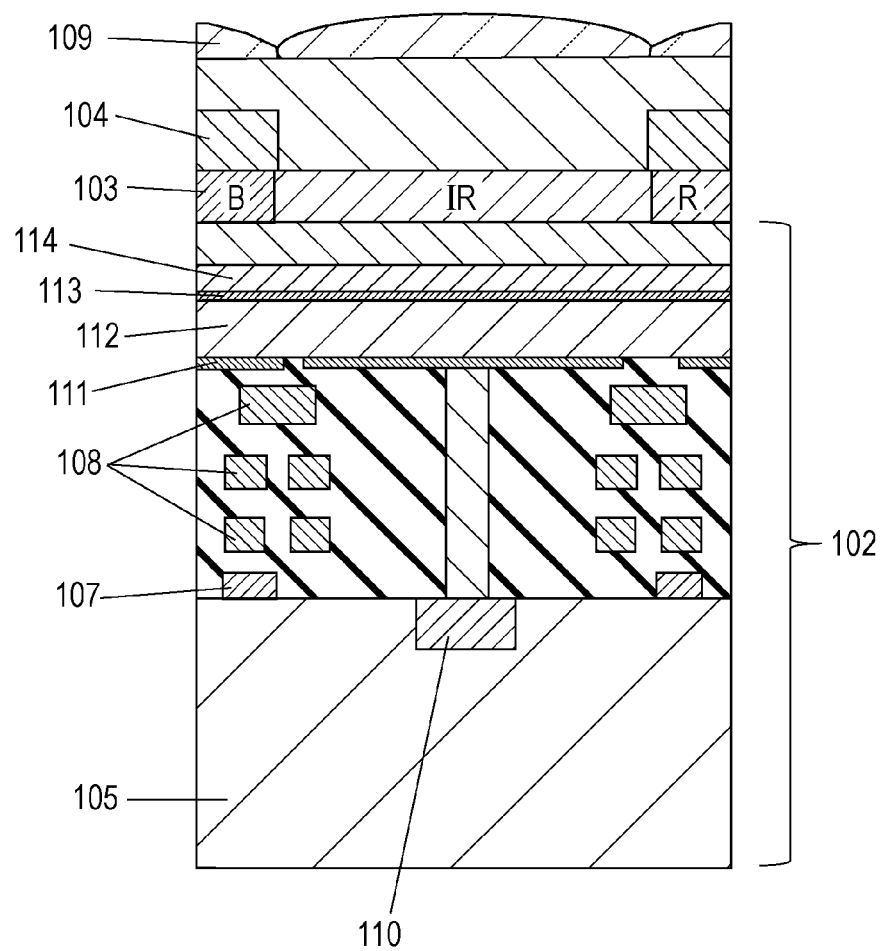
FIG. 9 is a cross-sectional view schematically illustrating a configuration of an image sensor according to a second embodiment.

FIG. 9 is a cross-sectional view schematically illustrating a configuration of the image sensor 101 according to the present embodiment. This image sensor 101 includes a signal accumulator 110 inside the silicon substrate 105 and includes a charge detection circuit and a photoelectric converter on the silicon substrate 105. The charge detection circuit includes the transistor 107 and the metal wire 108. The charge detection circuit detects a signal charge captured by a lower electrode 111 and outputs a signal voltage. The photoelectric converter includes an upper electrode 113, the lower electrode 111, and an organic photoelectric conversion film 112. The organic photoelectric conversion film 112 is interposed between the upper electrode 113 and the lower electrode 111. The lower electrode 111 and the signal accumulator 110 are electrically connected to each other. On the upper electrode 113, a protection film 114 is formed. On the protection film 114, as in the first embodiment, the color filter 103, the infrared absorption filter 104, and the micro lenses 109 are arranged.

A configuration of the organic photoelectric conversion film 112 will be described below in detail. The upper electrode 113 is formed of a conductive transparent material, for example, ITO. The lower electrode 111 can be formed of a metal such as aluminum or copper, or polysilicon doped with an impurity and imparted with conductivity, for example.

The organic photoelectric conversion film 112 according to the present embodiment can be formed by codeposition of Rubrene: C70 and SnNc: C70, for example. In order to give the image sensor 101 sensitivity from a visible region to a near-infrared region, two materials of Rubrene: C70 having a photoelectric conversion characteristic in a visible region and SnNc: C70 having a photoelectric conversion characteristic in an infrared region can be codeposited. It has been confirmed that using these materials can obtain quantum efficiency of on the order of 30% with respect to a near-infrared light whose wavelength is 1,000 nm to which sensitivity has scarcely been exhibited with silicon. In this case, as materials of the organic photoelectric conversion film 112, Rubrene: C70 and SnNc: C70 have been used. However, the material of the organic photoelectric conversion film 112 is not limited to these. For example, various metal complexes or an organic compound can be used. Examples of such metal complexes include a metal complex having, as a ligand, a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a condensed aromatic carbocyclic compound (a naphthalene derivative, an anthracene derivative, a phenanthrene derivative, a tetracene derivative, a pyrene derivative, a perylene derivative, or a fluoranthene derivative), or a nitrogen-containing heterocyclic compound. It should be noted that the material is not limited to the above-mentioned materials, and any organic compound that has an absorption characteristic in a visible region or a near-infrared region and can form a film as a photoelectric conversion layer can be used as a material forming the organic photoelectric conversion film 112, regardless of whether the material is low molecular weight or high molecular weight.

Except that the organic photoelectric conversion film 112 is used to improve sensitivity in a near-infrared region as the photoelectric conversion film of the image sensor 101, the configuration and the operation in the present embodiment is the same as those in the first embodiment. Various application examples described in the first embodiment are similarly applicable to the present embodiment.

An example will be described in which the imaging system according to the present embodiment is applied to a vehicle-mounted camera. The light source 124 that functions as near-infrared lighting can be used as a vehicle-mounted headlight, for example. The light source 124 can be a LED light source that emits a near-infrared light whose wavelength is 940 nm, for example. A center wavelength of the near-infrared light transmitted by the double-band pass filter 120 and a center wavelength of the near-infrared light absorbed by the infrared absorption filter 104 included in the image sensor 101 also can be designed to be 940 nm. Because a vapor absorbs a near-infrared light of 940 nm, for outside use with the sunlight as a light source, using this wavelength is advantageous. This is because an ambient light operating as a disturbance light is absorbed by a vapor in the air, and stable sensing of a near-infrared light is thus possible as compared with a case of using other wavelengths. This system enables accurate detection of surrounding conditions with two headlights of a near-infrared light and a visible light in the nighttime. In the daytime also, in an environment under which the glaring sunlight is directly incident, using a near-infrared image enables monitoring of surrounding conditions. Furthermore, in an environment with low visibility such as in the dawn time or the sunset time also, using a visible image and a near-infrared image in combination enables safer monitoring of the surrounding environment.

(Third Embodiment)

Remote sensing of a living body using a camera has been examined. This is a technique of using a camera to sense information on a living body (for example, information such as respiration, a heart rate, or a blood pressure) without contacting or giving a restraint feeling. Although a method of sensing using a conventional visible camera is general, attempts of using near-infrared lights have also been made. This is because a near-infrared light of 650 to 1,300 nm, which is referred to as a "biological window", has high permeability through a living body and is suitable to be used for acquiring information on a deeper region of a living body. The present embodiment is related to an imaging system used for biological sensing applications as described above.

Figure 10A:
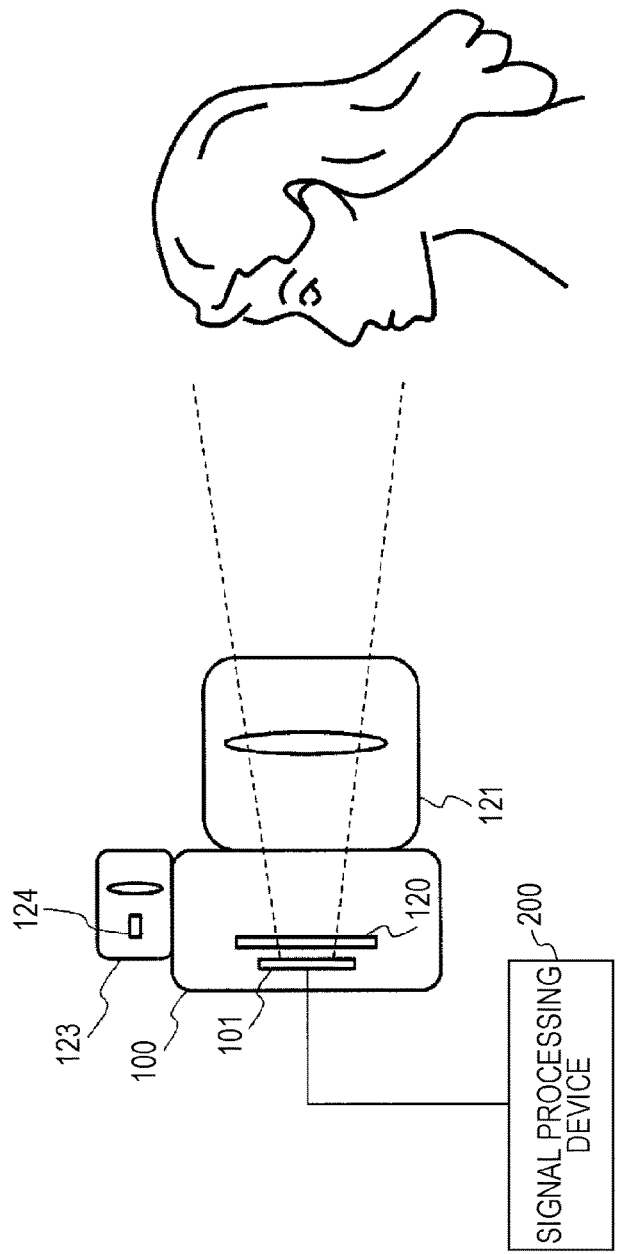
FIG. 10A is a diagram illustrating a schematic configuration of an imaging system according to a third embodiment.

FIG. 10A is a diagram illustrating a schematic configuration of the imaging system according to the present embodiment. In FIG. 10A, besides the imaging system, a person's face being an object is also indicated. A basic configuration of the imaging system according to the present embodiment is the same as the configurations in the first and the second embodiments. However, in the present embodiment, as the light source 124, an LED light source that emits a near-infrared light whose wavelength is 850 nm is used, for example. The center wavelength of the near-infrared light transmitted by the double-band pass filter 120 and the center wavelength of the near-infrared light absorbed by the infrared absorption filter 104 included in the image sensor 101 are also designed to be 850 nm. The light source of a visible light is not specially provided, and a general ambient light (for example, LED lighting in the room) is used as the light source.

Figure 10B:
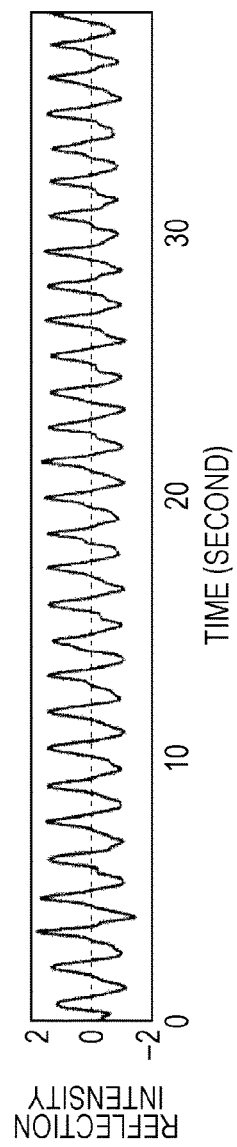
FIG. 10B illustrates a displayed result from plotting an average of values of near-infrared pixels in a region of 100×200 pixels in a forehead part in an acquired image at every predetermined time.

Imaging objects of the imaging system according to the present embodiment includes a living body. The signal processing device 200 can generate information on a living body by an operation using a plurality of electrical signals output from a near-infrared pixel and output the generated information. The signal processing device 200 also can generate a signal indicating an image in which information on a visible image is superimposed with information on a living body and output the generated signal. For example, together with a visible image, information indicating a change in a blood flow as illustrated in FIG. 10B which will be described later can be displayed on a display. "Information on a living body" herein can be various types of information related to bloods such as a heart rate, a blood flow, a blood pressure, or a saturation degree of blood oxygen, or various types of information related to a skin such as a concentration of a melanin pigment, presence or absence of a blotch, or presence or absence of a bruise, for example.

A result from imaging of a face with a focus on a forehead using the imaging system according to the present embodiment will be described. FIG. 10B illustrates a displayed result from plotting an average of values of near-infrared pixels in a region of 100×200 pixels in a forehead part in an acquired image at every predetermined time. It can be seen that because the near-infrared absorbance of blood changes in accordance with a change in the blood flow due to heart rate, the intensity of a reflected light changes with time. The change in the intensity of a reflected light represents pulsation, and it can be seen that information on the blood flow inside the skin is effectively captured by information obtained from a near-infrared image.

In the system according to the present embodiment, not only data of a near-infrared pixel but also data of a red pixel, a green pixel, and a blue pixel which are visible pixels can be acquired at the same time. A result from comparison made with respect to the above-mentioned data will be described below. An average of values of each of red pixels, green pixels, blue pixels, and near-infrared pixels in a region of 100×200 pixels in a forehead part is plotted at every predetermined time as shown in FIG. 10B, and with respect to data of each of the pixels, a heart rate change of 60 to 80 Hz has been observed. The heart rate data of each of the pixels has been analyzed, and it has been indicated that a signal-noise (SN) ratio of green pixels is the highest with a subject with a low ratio of melanin pigments, and a signal-noise (SN) ratio of near-infrared pixels is the highest with a subject with a high ratio of melanin pigments. This is thought to be because signal components of a light returning from the inside of the body have been decreased due to an influence of a melanin pigment on the surface of the skin. Furthermore, an experiment using a signal from a visible pigment has revealed that an influence of an ambient light easily exerts an influence. From the above-described results, it has been indicated that the system according to the present disclosure which can monitor information of a living body with a near-infrared light at the same time with a visible light is effective for detecting information on a living body more stably and accurately.

What is claimed is:

1. An imaging system comprising:
    a light source that, in operation, emits an emitted light containing a near-infrared light in a first wavelength region;
    an image sensor; and
    a double-band pass filter that is arranged on a path of an incident light entering the image sensor and transmits a visible light in at least a part of a wavelength region out of a visible region and the near-infrared light in the first wavelength region, wherein
    the image sensor includes:
        a substrate,
        light detection cells, each of the light detection cells, in operation, receiving a part of the incident light and outputting an electrical signal in accordance with a light receiving amount,
        a first filter that faces a first light detection cell included in the light detection cells and selectively transmits the near-infrared light in the first wavelength region,
        a second filter that faces a second light detection cell included in the light detection cells and selectively transmits a light in a second wavelength region contained in the visible light,
        a third filter that faces a third light detection cell included in the light detection cells and selectively transmits a light in a third wavelength region contained in the visible light,
        a fourth filter that faces a fourth light detection cell included in the light detection cells and selectively transmits a light in a fourth wavelength region contained in the visible light, and
        an infrared absorption filter that faces the second filter, the third filter, and the fourth filter, absorbs the near-infrared light in the first wavelength region, and transmits the visible light, and
        each of the light detection cells includes:
            a photoelectric converter, wherein the photoelectric converter includes:
            two electrodes,
            a signal accumulator disposed inside the substrate,
            an electrical connection between the signal accumulator and one of the two electrodes of the photoelectric converter, and
            a charge detection circuit that surrounds the electrical connection and that includes a transistor and a metal wire.

2. The imaging system according to claim 1, further comprising:
    a signal processing device that is connected to the image sensor and, in operation, generates a signal indicating an image by using a first electrical signal output from the first light detection cell, a second electrical signal output from the second light detection cell, a third electrical signal output from the third light detection cell, and a fourth electrical signal output from the fourth light detection cell.

3. The imaging system according to claim 2, wherein
    the image includes a visible image and a near-infrared image, and
    the signal processing device, in operation,
        generates a signal indicating the visible image by using the second electrical signal, the third electrical signal, and the fourth electrical signal, and
        generates a signal indicating the near-infrared image by using the first electrical signal.

4. The imaging system according to claim 2, wherein
    the signal processing device, in operation,
        generates information on a visible image by using the second electrical signal, the third electrical signal, and the fourth electrical signal, and
        superimposes the information on the visible image with information obtained by an operation using the first electrical signal to generate the signal indicating the image.

5. The imaging system according to claim 4, wherein
    the light source, in operation, emits the emitted light on a living body, and the information obtained by the operation using the first electrical signal is information on the living body.

6. The imaging system according to claim 2, wherein, in operation,
the signal processing device further generates information on a distance to an object by using the first electrical signal.

7. The imaging system according to claim 6, wherein
the emitted light is a pulse light, and
the signal processing device, in operation, generates the information on the distance by using a time taken by the pulse light to be detected by the light detection cells after emitted from the light source.

8. The imaging system according to claim 6, wherein, in operation,
the light source projects a pattern of lights on the object, and
the signal processing device generates information on a near-infrared image by using the first electrical signal, and generates the information on the distance based on a position of the pattern of lights in the near-infrared image.

9. The imaging system according to claim 6, wherein, in operation,
the signal processing device
generates information on a visible image by using the second electrical signal, the third electrical signal, and the fourth electrical signal, and
superimposes the information on the visible image with the information on the distance to generate the signal indicating the image.

10. The imaging system according to claim 6, wherein
the image is a stereo image, and
the signal processing device, in operation,
generates information on a visible image by using the second electrical signal, the third electrical signal, and the fourth electrical signal, and
uses the information on the distance to convert the visible image into the stereo image.

11. The imaging system according to claim 1, wherein
each of the light detection cells further includes:
an organic photoelectric conversion film between the two electrodes.

12. The imaging system according to claim 1, wherein
the infrared absorption filter is an organic membrane filter.

13. The imaging system according to claim 11, wherein
the organic photoelectric conversion film is continuously formed among the light detection cells.

14. The imaging system according to claim 13, wherein
the organic photoelectric conversion film has a photoelectric conversion characteristic in a visible region and a near-infrared region.

* * * * *